United States Patent [19]
Watanabe

[11] Patent Number: 5,880,521
[45] Date of Patent: Mar. 9, 1999

[54] SUPER-CONDUCTIVE WIRING AND SEMICONDUCTOR DEVICE USING THE SAME

[75] Inventor: Hiroshi Watanabe, Kawasaki, Japan

[73] Assignee: Kabushiki Kaisha Toshiba, Kawasaki, Japan

[21] Appl. No.: 581,499

[22] Filed: Dec. 29, 1995

[30] Foreign Application Priority Data

Jan. 5, 1995 [JP] Japan .................................. 7-000294
Dec. 5, 1995 [JP] Japan .................................. 7-316508

[51] Int. Cl.$^6$ .................................................. H01L 39/00
[52] U.S. Cl. .......................................... 257/661; 257/663
[58] Field of Search ................................ 257/661, 662, 257/663; 505/125, 777, 778

[56] References Cited

U.S. PATENT DOCUMENTS

| | | | |
|---|---|---|---|
| 5,183,800 | 2/1993 | Nakagawa ................................. | 257/662 |
| 5,283,465 | 2/1994 | Yamazaki ................................. | 257/663 |
| 5,430,012 | 7/1995 | Nakamura et al. ...................... | 257/661 |

FOREIGN PATENT DOCUMENTS

| | | | |
|---|---|---|---|
| 0 359 411 | 3/1990 | European Pat. Off. . | |
| 0 534 854 | 3/1993 | European Pat. Off. . | |
| 608100 | 7/1994 | European Pat. Off. ............... | 257/661 |

OTHER PUBLICATIONS

Physical Review Letters, vol. 73, No. 25, pp. 3463–3466, Dec. 19, 1994, M. Azuma, et al., "Observation of a Spin Gap in SrCu2O3 Comprising Spin–1/2 Quasi–1D Two–Leg Ladders".

Cava, R.J., et al., A New Homologous Series of Lanthanum Copper Oxides, Journal of Solid State Chemistry, vol. 94, pp. 170–184 (1991).

Daagotto, E., et al. Surprises on the Way from One– to Two–Dimensional Quantum Magnets: The Ladder Materials, Science, vol. 271, pp. 618–623 (1996).

D.C. Johnston, et al. "Magnetic Susceptibility of $(Vo)_2P_2O_7$: A One–Dimensional Spin–½ Heisenberg Antiferromagnet with a Ladder Spin Configuration and a Singlet Ground State", The Physical Review B, vol. 35, No. 1, Jan. 1, 1987, pp. 219–222.

Z. Hiroi, et al. "A New Homologous Series $Sr_{n-1}Cu_{n+1}O_{2n}$ Found in the SrO–CuO System Treated Under High Pressure", Journal of Solid State Chemistry, vol. 95, 1991, pp. 230–238.

E. Dagotto, et al. "Superconductivity in Ladders and Coupled Planes", The Physical Review B, vol. 45, No. 10, Mar. 1, 1992, pp. 5744–5747.

Rice et al., "Superconductivity, Spin Gaps and Luttinger Liquids in a Class of Cuprates," Europhysics Letters, vol. 23, No. 6, pp. 445–449, 1993.

Sigrist et al., "Superconductivity in a Quasi–One–Dimensional Spin Liquid," Physical Review B, vol. 49, No. 17, pp. 12058–12061, May 1, 1994.

Primary Examiner—Mahshid Saadat
Assistant Examiner—S. V. Clark
Attorney, Agent, or Firm—Oblon, Spivak, McClelland, Maier & Neustadt, P.C.

[57] ABSTRACT

An integrated circuit device comprises a plurality of integrated circuit layers formed on a semiconductor substrate, a wiring layer having a ladder-like lattice and formed of a material exhibiting superconductivity in a longitudinal direction, the wiring layer connecting arbitrary integrated circuit layers of the plurality of integrated circuit layers, and an isolation layer having a ladder-like lattice and formed of the same material as the wiring layer such that a resistance in a widthwise direction is higher than that in a longitudinal direction, the isolation layer isolating an arbitrary integrated circuit layer of the plurality of integrated circuit layers.

34 Claims, 10 Drawing Sheets

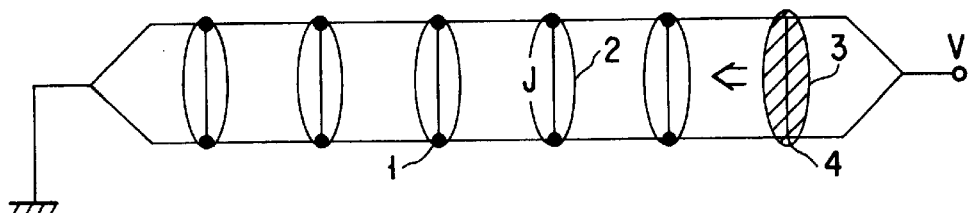
F I G. 1
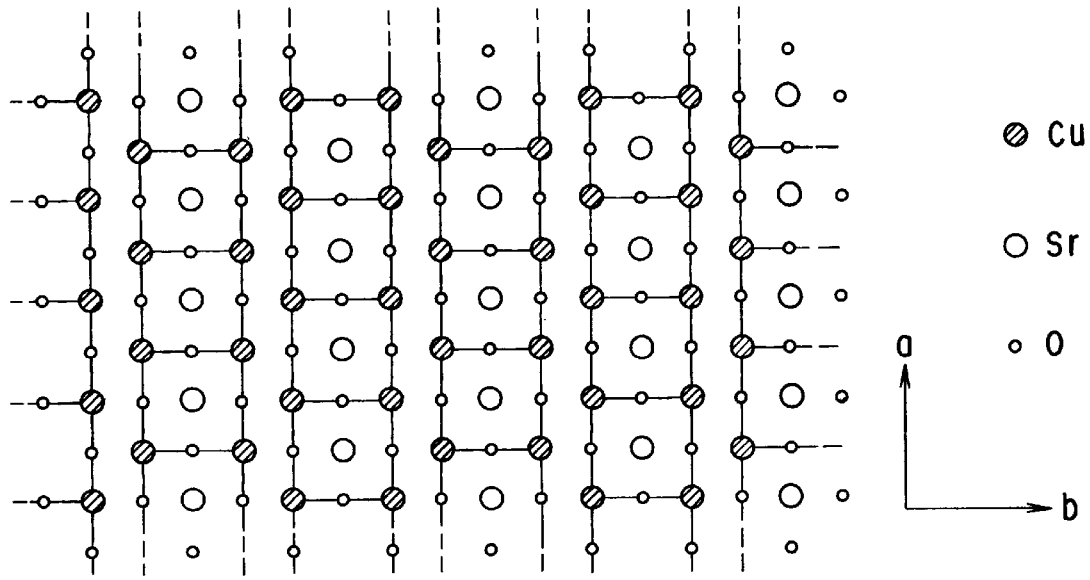
F I G. 2
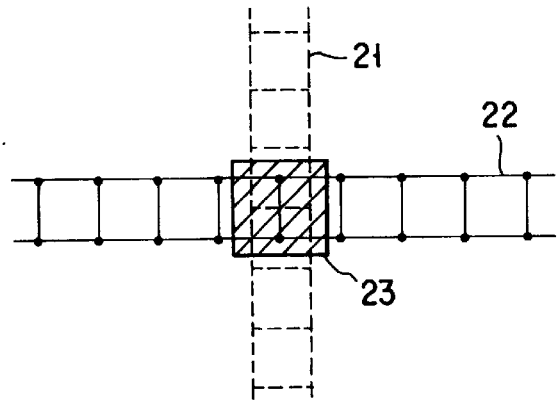
F I G. 4A
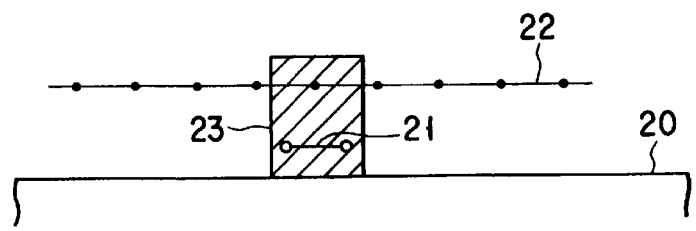
F I G. 4B

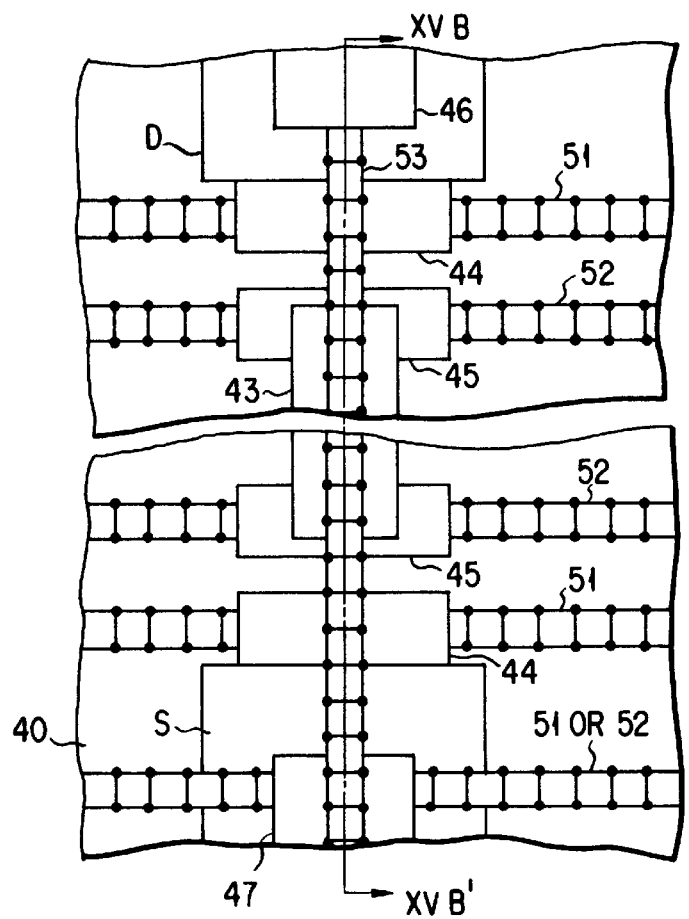
F I G. 15A
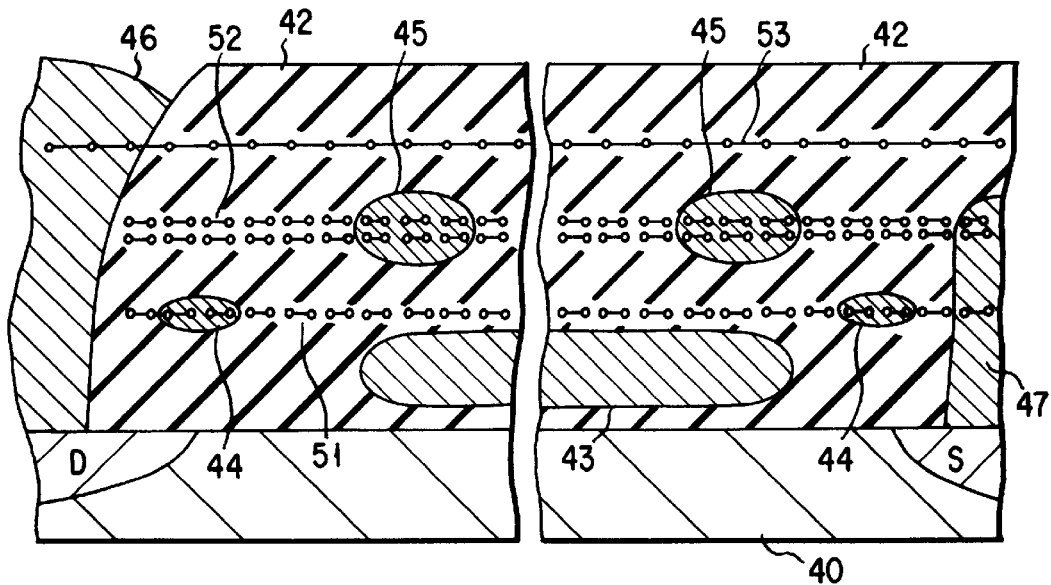
F I G. 15B

SUPER-CONDUCTIVE WIRING AND SEMICONDUCTOR DEVICE USING THE SAME

BACKGROUND OF THE INVENTION

1. Field of the Invention

The present invention relates to a super-conductive wiring used for electrical connection between circuit elements and an isolation element used for electrical isolation between the circuit elements of the semiconductor device, which contribute to ultra-high integration of a semiconductor device and further relates to a semiconductor device using the super-conductive wiring and the isolation element.

2. Description of the Related Art

Conventionally, various materials such as Al, poly-Si, W, Ti, and so on have been used for a wiring for electrically connecting circuit elements in a semiconductor device. However, all these materials are difficult to be made to single crystals and hence leave high resistances. Further, these materials are not suitable for micropatterning of the wiring of the semiconductor device.

In the semiconductor industry, large-scale integration has been achieved by decreasing the size of each circuit element. The term "circuit element" means a functional device (e.g., MOS transister, bipolar transister, capacitor, diode, pin-junction, Quantum Blackade device, Josephson junction resistor, conductor and so on), wiring and isolator. The industry has developed to date with improvements in techniques (e.g., a manufacturing process and the design of a functional device and a circuit) to decrease the size of the circuit elements. However, this monotonous improvement is approaching its intrinsic limit caused by a quantum effect which has become an essential factor with advances in micropatterning of the circuit elements. For example, if the distance between two wirings becomes as short as the spread of the wave-like motion of electrons, then the charge of one electron shares two wirings; thereby the leakage of charge appearing.

Recently, in order to achieve ultra-high integration, an ultra-fine circuit element exhibiting much higher performance than a conventional one has been researched and developed in accordance with the operation principle based on a quantum effect. If, however, the sizes of wirings and isolations remain same as the conventional sizes, the ultra-high integration cannot be achieved even though an ultra-fine circuit element is realized. It is accordingly desired that an ultra-fine wiring and isolation as well as an ultra-fine circuit element are realized.

SUMMARY OF THE INVENTION

Therefore, it is an object of the present invention to provide an ultra-fine wiring with an extremely low resistance and an ultra-fine isolation for semiconductor device. The advantage of an ultra-fine structure like this is realized by the principle of an intrinsic quantum phenomena.

It is another object of the present invention to provide a semiconductor device, the ultra-fine wiring and isolation.

According to the present invention, there is provided an ultra-fine wiring used for a semiconductor device and having a ladder-like lattice structure, wherein the ladder-like lattice structure is formed of a material exhibiting superconductivity in a longitudinal direction of the ladder-like lattice structure.

According to the present invention, there is provided a semiconductor device comprising:

a plurality of circuit layers which means layers including circuit elements and formed on a semiconductor substrate; and a wiring layer which means a layer in a single crystal having a ladder-like lattice structure and formed of a material exhibiting superconductivity only in a longitudinal direction, the wiring layer connecting arbitrary circuit layers of the plurality of circuit layers.

According to the present invention, there is provided an ultra-fine electrically isolation having a ladder-like lattice structure, wherein the ladder-like lattice structure is formed of a material which has a higher resistance in a widthwise direction than in a longitudinal direction.

According to the present invention, there is provided another semiconductor device comprising:

a plurality of circuit layers formed on a semiconductor substrate; and an isolation layer having a ladder-like lattice and formed of a material having a higher resistance in a widthwise direction than in a longitudinal direction, the isolation layer isolating an arbitrary circuit layer of the plurality of circuit layers.

According to the present invention, there is provided a further semiconductor device comprising:

a plurality of circuit layers formed on a semiconductor substrate;

a wiring layer having a ladder-like lattice and formed of a material exhibiting superconductivity in a longitudinal direction, the wiring layer connecting arbitrary circuit layers of the plurality of circuit layers; and an isolation layer having a ladder-like lattice and formed of a material having a higher resistance in a widthwise direction than in a longitudinal direction, the isolation layer isolating an arbitrary semiconductor layer of the plurality of semiconductor layer.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a view showing a crystal structure exhibiting a ladder-like lattice according to the first embodiment of the present invention;

FIG. 2 is a view showing a crystal structure represented by $Sr_2Cu_4O_6$ according to the first embodiment;

FIG. 4A is a plan view showing a crossing state of uni-axial super-conductive wiring according to the third embodiment of the present invention;

FIG. 4B is a cross-sectional view showing a crossing state of uni-axial super-conductive wiring according to the third embodiment of the present invention;

FIG. 15A is a plan view showing a case wherein a uni-axial super-conductive wiring according to the eighth embodiment is applied to a NAND cell;

FIG. 15B is a cross-sectional view showing a case wherein a uni-axial super-conductive wiring according to the eighth embodiment is applied to a NAND cell;

DETAILED DESCRIPTION OF THE PREFERRED EMBODIMENTS

Figure 3A:
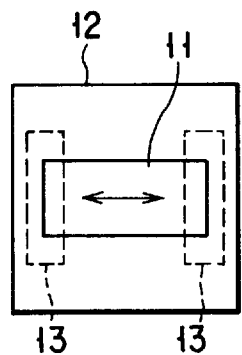
FIG. 3A is a view showing first example of a semiconductor device using uni-axial super-conductive wiring according to the second embodiment of the present invention.

Embodiments of the present invention will be described below with reference to the accompanying drawings.

A wiring (i.e., ultra-fine uni-axial super-conductive wiring) used for a semiconductor device, according to the first embodiment of the present invention will be described first. In the present invention, a superconducting phenomenon is used which can be appeared even upon decreasing the size of each wiring unit to an atomic size, by the use of a quantum effect characteristic of a single crystal having a ladder-like double-chain lattice structure appearing in e.g., (1) $X_xY_yZ_zCu_\alpha O_\beta$, wherein X, Y, Z are selected from the group consisting of Sr, La, Ca, Ba, and Y and (2) $(VO)_2P_2O_7$, thereby realizing an ultra-fine uni-axial super-conductive wiring having a extremely low electrical resistance, only in the longitudinal direction of the ladder-like lattice and much higher resistance in the widthwise direction of the ladder-like lattice.

FIG. 1 shows a ladder-like double-chain lattice structure. Referring to FIG. 1, reference numeral 1 denotes an electron; 2, a singlet state of two electrons; 3, a hole singlet state; and 4, a lattice point of the ladder-like lattice. Electrons 1 are located on the lattice points 4. A singlet state 2 is formed by electrons 1 localized on two adjacent lattice points 4 on the chains.

For the sake of simplicity, consider a case wherein V=0V. Each lattice point 4 is assumed to be a univalent cation, and one electron 1 (having a spin-½ and a charge of −e) is localized to establish electrical neutrality. For this reason, each lattice point 4 has only a magnetic property of a spin-½. Assume that when the strength of magnetic interaction in the chain direction is considered as a unit of energy, the strength of magnetic interaction across the chains is represented by $\lambda$. Note that this magnetic interaction across the chains is antiferromagnetic in this example.

In a quantum-mechanical ground state, two spin-½ across the chains form a singlet state with spin-0, that is, spinless.

Consider a case wherein V>0. Two electrons 1 which form a singlet state 2 at the rightmost position in FIG. 1 are extracted toward the electrode side, thereby a hole singlet 3 appearing. This hole singlet 3 can be regarded as a spinless quasiparticle with a charge of 2e, which runs to the left in FIG. 1 because of an electric field. At the same time, the second and subsequent quasiparticles with only charge 2e are also generated near the electrode on the right side and run to the left. In order to realize charge transfer with a extremely low resistance in only one axial direction, it is important that these quasiparticles can freely move in only the axial direction (longitudinal direction) of the ladder-like structure.

In addition, in order to realize charge transfer based on such a quantum effect, the temperature is preferably set to satisfy following inequality:

$$k_B T < t^2/\lambda \qquad (1)$$

where $k_B$ is the Boltzman's constant, T is the temperature, and t is the mobility of an electron to an adjacent lattice point within a chain.

A single crystal expressed by $Sr_{n-1}Cu_{n+1}O_{2n}$ and exhibiting superconductivity in only one axial direction has an SrO—CuO plane structure like the one shown in FIG. 2. Referring to FIG. 2, each full circle represents Cu; each large open circle, Sr; and each small open circle, O. Since Cu corresponds to a lattice point on which one electron is localized, each solid line represents an antiferromagnetic interaction λ(>0) in the ladder-like lattice. In a structure of Cu—O—Cu, Cu and another Cu are antiferromagnetically coupled.

The number (Δn) of chains in the ladder-like structure is determined by the following equation:

$$\Delta n = (n+1)/2 \qquad (2)$$

FIG. 2 corresponds to a case wherein n=3. That is, the number (Δn) of chains in the ladder-like structure is two.

A 180 degrees structure of Cu—O—Cu is formed in the a-axis direction in FIG. 2. Chains each composed of spin-½'s (Cu) extend parallel to this axial direction. When n=3, each two adjacent chains are strongly and antiferromagnetically coupled to each other with a 180 degrees structure of Cu—O—Cu, thereby realizing a two-chain ladder-like lattice.

An inter-ladder interaction (λ') is composed of a Cu—Cu band. This interaction is ferromagnetic and rather weaker than the interchain interaction λ (|λ'|/λ up to 0.1). Since the interaction λ' is weak, the quantum effects based on the ladder-like lattices dominate the overall system to realize an ultra-fine uni-axial super-conductive wiring with a extremely low resistance in the a-axis direction.

In this case, it is desirable that n=4L−1 and L is not a very large natural number. A superconducting phenomenon is used which can appear even upon decreasing the size of each wiring layer to an atomic size, by the use of a quantum effect characteristic of a ladder-like double-chain lattice structure appearing in a compound, thereby realizing uniaxial super-conductivity with an extremely small resistance.

In addition, since the super-conductive wiring of this embodiment exhibits superconductivity in only the a-axis direction, a plurality of ladder-like lattices in FIG. 2 may be used as one wiring as a whole, or the respective ladder-like lattices may be used as different wirings. When a plurality of ladder-like lattices are to be used as one wiring, the present invention can be effectively used if the distance between wirings is set to be about 60 to 20 nm below which the charges are conductive between two wirings due to the spread of the wave-like motion of an electron. Note that both the wiring width and the width between the wirings is preferably set in the above range. When a general $SiO_2$ insulating film is to be formed around a super-conductive wiring layer, in particular, width between wirings which is about 40 nm or less is effective. If the respective ladder-like lattices are used as different wirings, many parallel wirings can be realized even with a small line width (Δn).

Note that it is arbitrary whether a plurality of ladder-like lattices are to be used as one different wirings in the embodiment explained bellow.

Figure 3B:
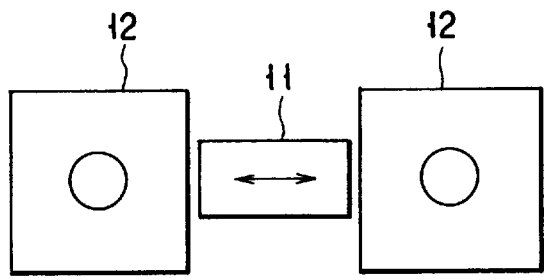
FIG. 3B is a view showing second example of the semiconductor device using a uni-axial super-conductive wiring according to the second embodiment of the present invention.
Figure 3C:
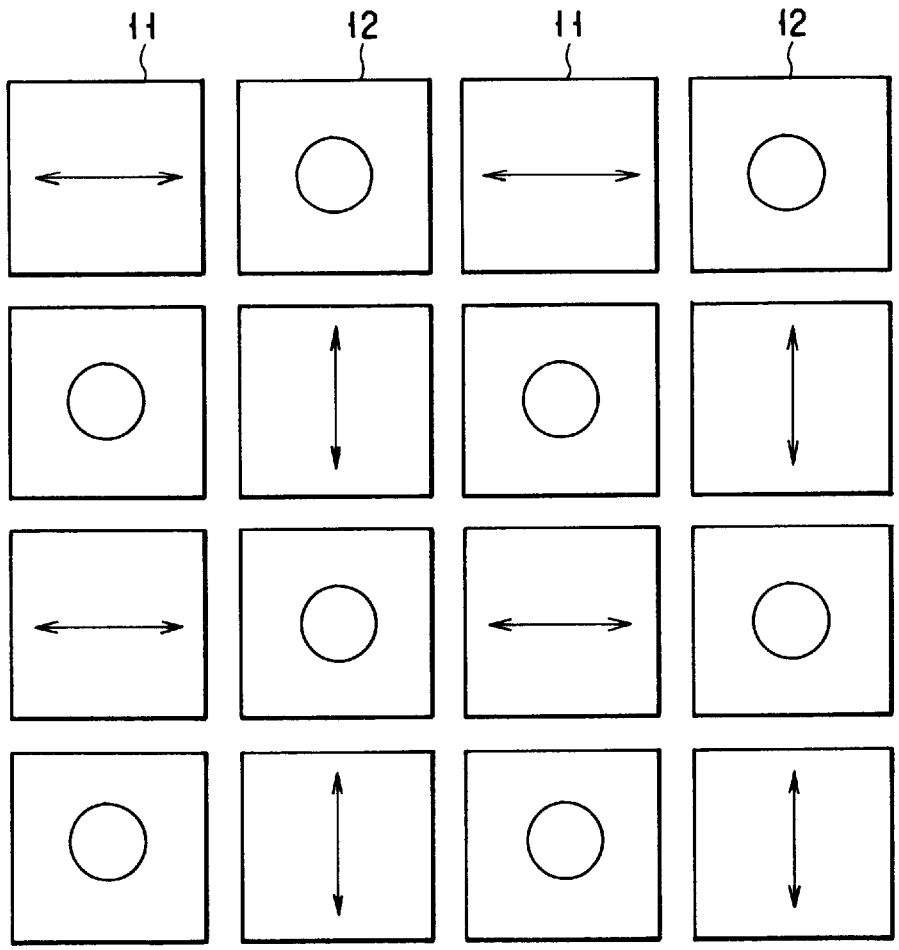
FIG. 3C is a view showing third example of the semiconductor device using a uni-axial super-conductive wiring according to the second embodiment of the present invention.

The second embodiment of the present invention will be described next. A semiconductor device using the uni-axial super-conductive wiring of the first embodiment will be described as the second embodiment with reference to FIGS. 3A to 3C. Referring to FIGS. 3A to 3C, reference numeral 11 denotes an ultra-fine uni-axial super-conductive wiring layer; 12, a circuit element; and 13, a diffusion region. The arrow in each uni-axial super-conductive wiring layer 11 corresponds to the a-axis direction in FIG. 2.

FIG. 3A shows a first example wherein the diffusion regions 13 in the circuit element 12 are connected to each other through the super-conductive wiring layer 11. In this case, the wiring layer 11 is obtained by patterning a crystal having an SrO—CuO plane structure like the one shown in FIG. 2 in a predetermined width along the a-axis direction. In addition, since the direction of a ladder-like lattice is dependent on the plane azimuth of an underlayer, the plane azimuth of an underlying substrate is selected such that the direction indicated by the arrow in FIG. 3A coincides with the a-axis direction.

The a-axis direction can be checked by irradiating X-rays. More specifically, this checking operation is performed by checking an analytical image obtained by analyzing an X-ray image obtained upon irradiation of X-rays. Therefore, setting the direction of a uni-axial super-conductive wiring layer can be performed by rotating a wafer, on which an element is to be formed, and checking the axial direction while irradiating X-rays. In addition, a plurality of ladder-like lattices are preferably connected to two areas which are to be connected to each other through a uni-axial super-conductive wiring layer. Assume that patterning or film formation is performed in a direction obliquely deviated from a predetermined axial direction. Even in this case, it suffices if the above two areas are connected through at least one ladder-like lattice.

FIG. 3B shows a second example wherein the above uni-axial super-conductive wiring layer 11 is used to connect the circuit elements 12 (,more precisely, their conductive portions,) to each other. In this case as well, similar to the case in FIG. 3A, the uni-axial super-conductive wiring layer 11 is formed by patterning a crystal having an SrO—CuO plane structure in a predetermined width along the a-axis direction. In addition, Note that two conductive portions connected by a wiring have not to be formed on the same layer.

FIG. 3C shows a case wherein many circuit elements 12 are arranged in the form of a checkered pattern, and super-conductive wiring layers 11 are arranged between the adjacent circuit elements 12. In this case, each super-conductive wiring layer 11 is conductive in only one direction along the arrow but is not conductive in other directions. That is, the circuit elements 12 can be electrically connected to each other in directions indicated by the arrows in FIG. 3C, while element isolation can be performed in directions perpendicular to the above directions.

Each circuit element 12 may be obtained by forming a circuit having a special function on one substrate. Alternatively, the circuit elements 12 obtained by forming circuits having special functions on chips may be arranged on a substrate. The conducting direction of each super-conductive wiring layer 11 is dependent on the plane azimuth of an underlayer in the manufacturing process. For this reason, when connection is to be performed as shown in FIG. 3C, each super-conductive wiring layer 11 may be formed on another chip in advance, and may be interposed between the circuit elements 12 on the substrate. In other words, when circuit elements formed on respective layers are arranged on a substrate, arranging a layer on which is to be formed a uni-axial wiring is to select two circuit elements connected in the longitudinal direction and other two circuit elements isolated in the width wise direction.

The third embodiment of the present invention will be described next. FIGS. 4A and 4B show an wiring according to the third embodiment of the present invention. FIG. 4A is a plan view of the wiring. FIG. 4B is a sectional view of the wiring. Ladder-like lattices 21 and 22, which are formed in two layers in which the longitudinal directions of the ladder-like lattices are perpendicular to each other, are formed on a substrate 20 and electrically connected to each other through a contact region 23 (indicated by hatching in FIGS. 4A and 4B).

The ladder-like lattices 21 and 22 constitute an ultra-fine uni-axial super-conductive wiring like the one described above. As the contact region 23, a circuit element such as a transistor, a resistor, or a capacitor, a diffusion region constituting part of such circuit element, or the like may be properly selected. Alternatively, a conductor such as Al, Ti, or poly-Si may be used.

As described above, in this embodiment, since the two ultra-fine uni-axial super-conductive wiring layers constituted by ladder-like lattices are stacked on each other, not only a parallel wiring structure but also an orthogonal wiring structure in which wirings are in contact with each other at the intersection, or a wiring structure in which wirings cross and contact each other at an arbitrary angle can be obtained. In addition, such a multilayered structure is not limited to a structure constituted by two layers of ladder-like lattices and may be constituted by three or more stacked layers.

Figure 5A:
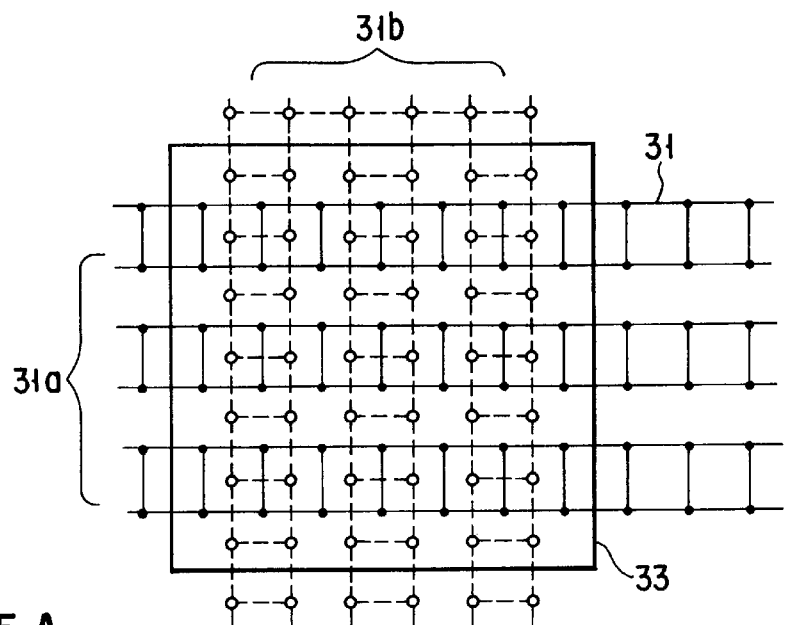
FIG. 5A is a plan view showing another crossing state of uni-axial super-conductive wiring according to the fourth embodiment of the present invention.
Figure 5B:
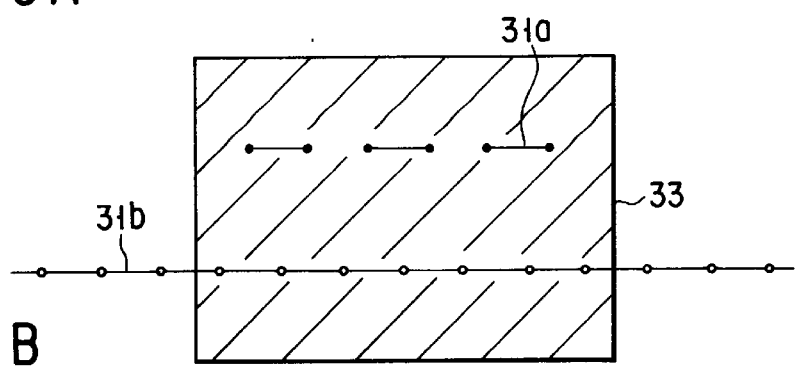
FIG. 5B is a cross-sectional view showing another crossing state of uni-axial super-conductive wiring according to the fourth embodiment of the present invention.

The fourth embodiment of the present invention will be described next. FIGS. 5A and 5B show an wiring according to the fourth embodiment of the present invention, more specifically, a multilayered orthogonal wiring. FIG. 5A is a plan view of the wiring. FIG. 5B is a sectional view of the wiring. Such a structure is constituted by two or more layers of the ladder-like lattices (two layers in this case). The contact layer 33 includes at least one of the ladder-like structures of both upper and lower layers 31a and 31b.

As the contact region 33, a circuit element such as a transistor, a resistor, or a capacitor, a diffusion region constituting part of such circuit element, or the like may be properly selected. Alternatively, a conductor such as Al, Ti, or poly-Si may be used.

Figure 6:
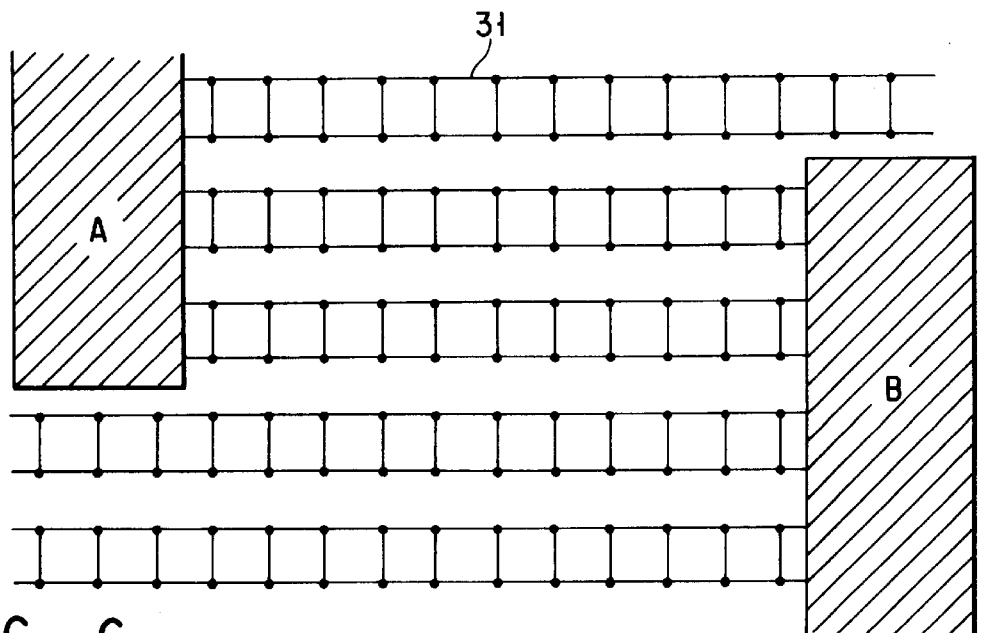
FIG. 6 is a view showing uni-axial super-conductive wiring according to the fifth embodiment of the present invention.
Figure 7:
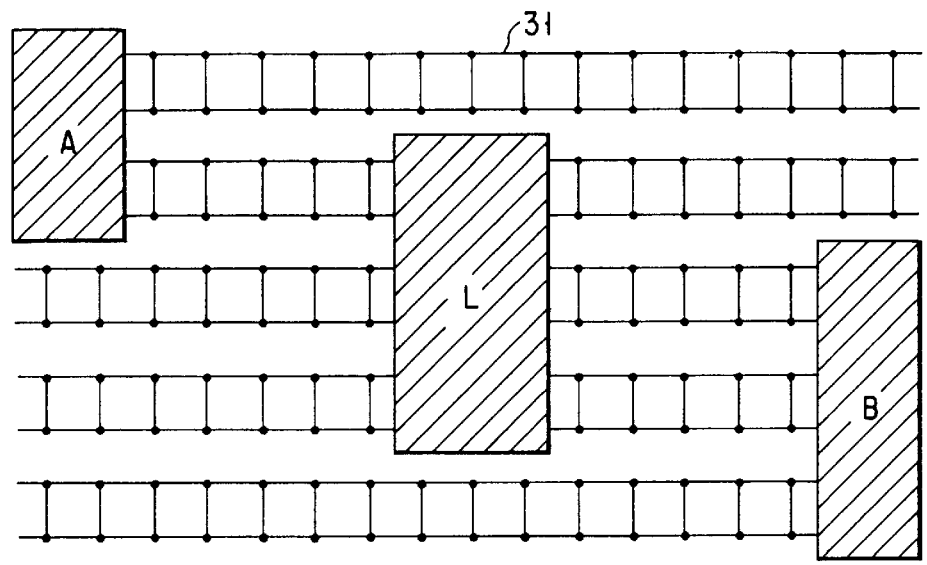
FIG. 7 is a view showing uni-axial super-conductive wiring according to the fifth embodiment.
Figure 8:
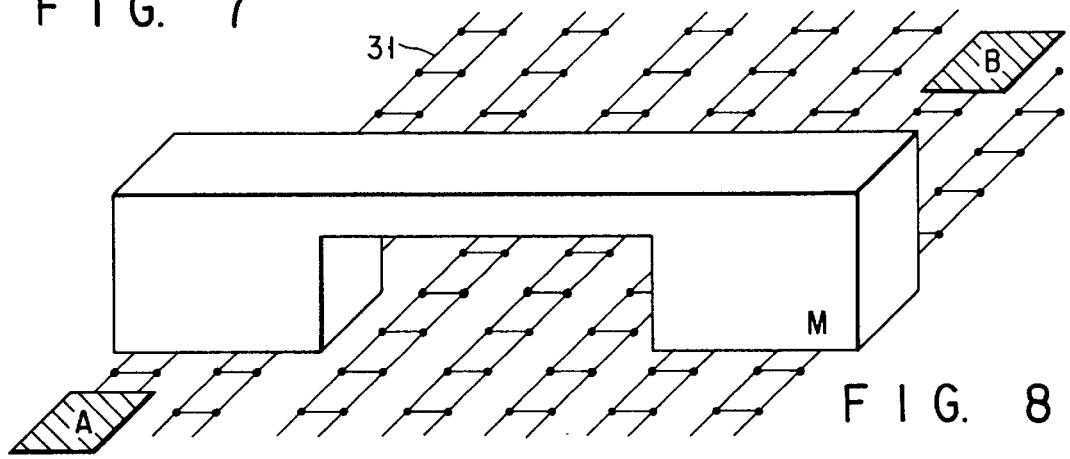
FIG. 8 is a view showing the super-conductive wiring according to the fifth embodiment.

The fifth embodiment of the present invention will be described next. FIGS. 6 to 8 show wirings according to the fifth embodiment of the present invention. Reference numeral 31 denotes a ladder-like lattice. Reference symbols A, B, and L denote areas in which circuit elements or the like are mounted; and M, a conductive area. In each of the examples shown in FIGS. 6 to 8, a plurality of ladder-like lattices 31 are arranged parallel to each other. It is easy to realize such arrangement by the use of single crystal compound.

In the case shown in FIG. 6, the areas A and B are spaced apart from each other in the direction which the ladder-like lattices 31 exhibit uni-axial super-conductivity, and are in contact with the ladder-like lattices. The areas A and B share one or more (two in this case) ladder-like lattices. The areas are therefore electrically connected to each other through the shared ladder-like lattices. As the areas A and B, circuit elements such as a transistor, a resistor, conductor, or a capacitor, electrodes and diffusion regions, and so on constituting portions of circuit elements may be properly selected.

In the case shown in FIG. 7, although the areas A and B share no ladder-like lattice, the areas A and L share one ladder-like lattice, the areas B and L share two other ladder-like lattices. The areas A and B are therefore indirectly connected to each other through the lattice shared by areas A and L, area L, and lattices shared by the areas L and B. As the area L, circuit elements such as a transistor, a resistor, conductor, or a capacitor, and electrodes diffusion regions, and so on constituting portions of the circuit elements may be properly selected. In the case shown in FIG. 8, the areas A and B share no ladder-like lattice but are electrically connected to each other through the conductive bridge M, which is three-dimensionally formed. As the bridge M, circuit elements such as a transistor, a resistor, conductor, and a capacitor, and electrodes, diffusion regions, and son on constituting portions of the circuit elements may be properly selected. Note that the areas A and B indirectly connected by the conductive bridge M may be formed on the same layer (corresponding to FIG. 8), one (A) and another (B), one (A) others (B), or some (A) and others (B).

Figure 9:
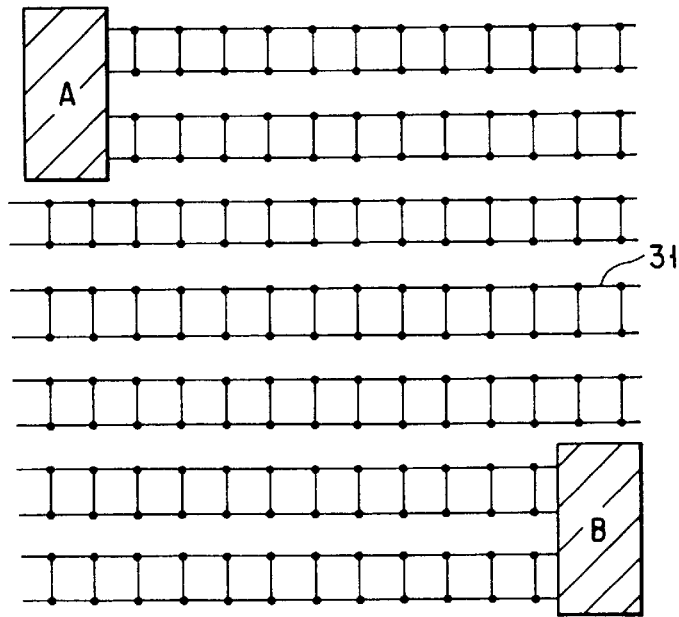
FIG. 9 is a view showing an electrical isolation wiring constituted by uni-axial super-conductive wiring according to the sixth embodiment of the present invention.
Figure 10:
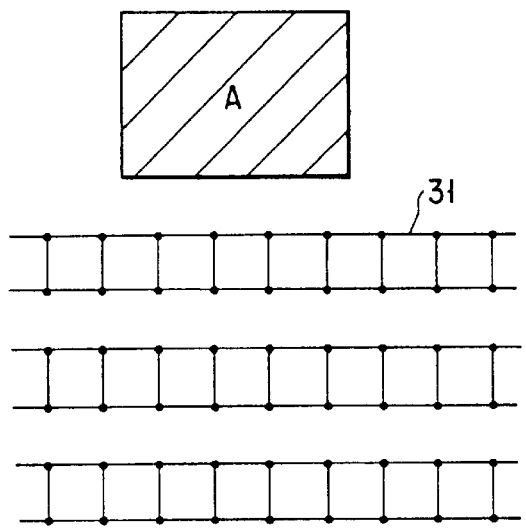
FIG. 10 is a view showing an electrical isolation constituted by uni-axial super-conductive wiring according to the sixth embodiment.

The sixth embodiment of the present invention will be described next. FIGS. 9 and 10 show electrical isolations according to the sixth embodiment, more specifically, parallel extending ladder-like lattices used for examples of isolation. It is easy to realize this arrangement if a single crystal is used. Referring to FIGS. 9 and 10, the areas A and B described in the fifth embodiment share no ladder-like lattices and hence are electrically isolated from each other. In this case, since ladder-like lattices 31 described in the fifth embodiment are conductive in one direction but are not conductive in other directions, areas A and B arranged along a direction perpendicular to the conductive direction of the ladder-like lattices 31 can be electrically isolated from each other. If the areas A and B are circuit elements o their portions, element isolation can be performed.

Figure 11:
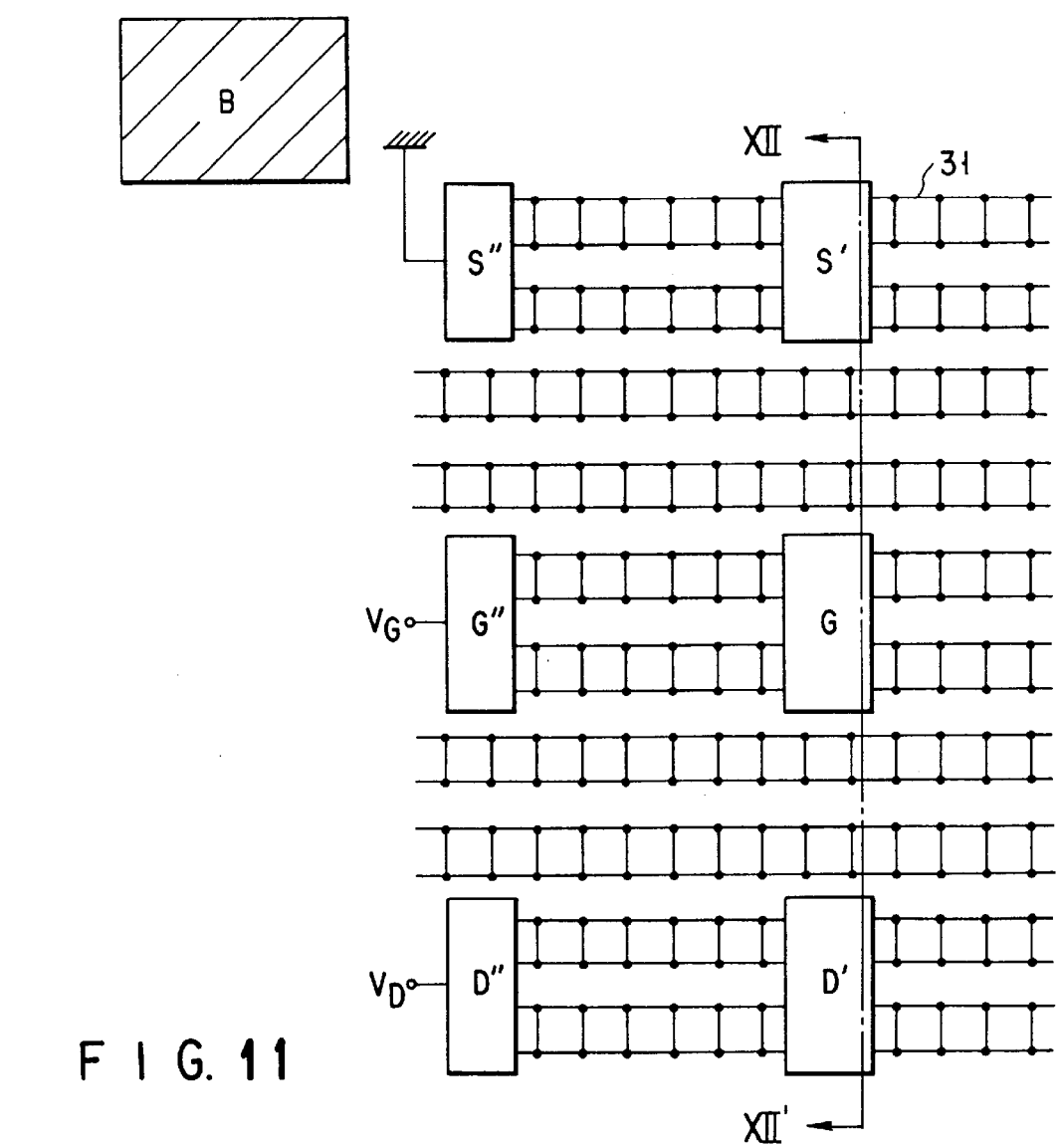
FIG. 11 is a plan view showing a case wherein a uni-axial super-conductive wiring according to the seventh embodiment of the present invention is applied to a MOS device.
Figure 12:
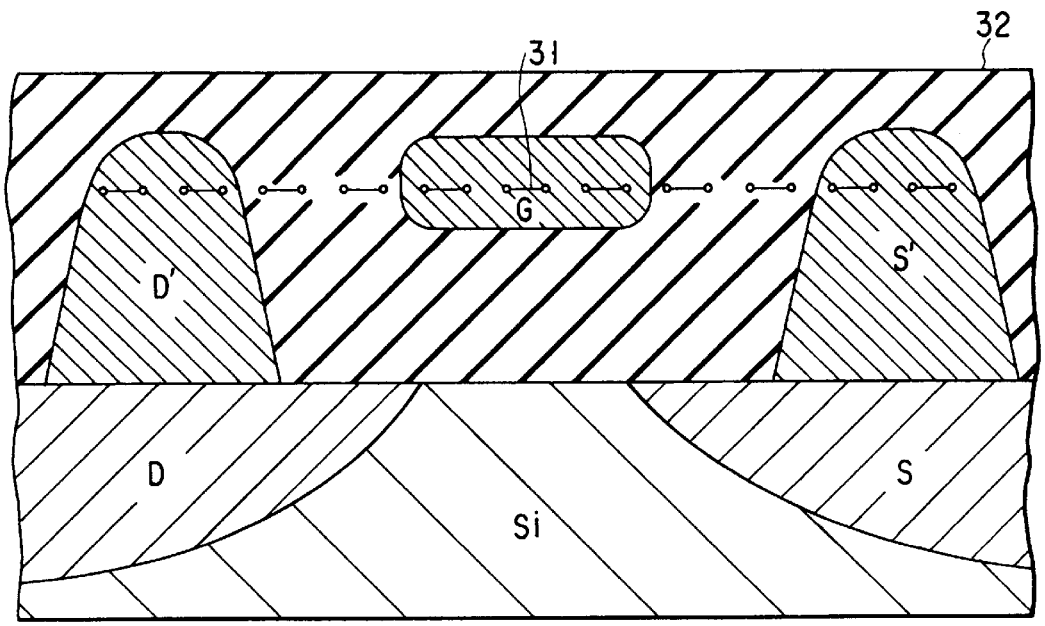
FIG. 12 is a cross-sectional view showing a case wherein uni-axial super-conductive wiring according to the seventh embodiment is applied to a MOS device.

The seventh embodiment of the present invention will be described next. FIGS. 11 and 12 show an wiring according to the seventh embodiment of the present invention, more specifically, an example wherein parallel wirings are used for a MOS device. Referring to FIGS. 11 and 12, reference numeral 31 denotes a ladder-like lattice; and 32, an insulating film consisting of $SiO_2$ or the like. Reference symbol G denotes a gate electrode; S, a source; D, a drain; S', a source electrode; D', a drain electrode; and S", D", and G", electrodes respectively connected to the electrodes S', D', and G. Referring to FIG. 11, the ladder-like lattices 31 as ultra-fine parallel wirings are formed between the electrodes S'and S", G and G", and D' and D". FIG. 12 shows a sectional view of the MOS device. The electrodes S' and D' are respectively in contact with the source S and the drain D through a conductor such as Al, Ti, poly-Si, etc.

Since each of the pairs of electrodes S' and S", G and G", and D' and D" share one or more ladder-like lattices these pairs are respectively connected to each other. Note that ladder-like lattices between the electrodes S" and G, and between the electrodes G and D' are used as the electrically isolation elements in seventh embodiment and the numbers of the ladder-like lattices between the electrodes S' and G, and between the electrodes G and D' are arbitrary. Furthermore, these lattices used for isolations in FIGS. 11 and 12 may be used as wirings connecting other circuit elements. In addition, since ladder-like lattices are conductive in only one axial direction but are insulative in other directions, they also provide insulation across parallel wiring ladders.

Figure 13:
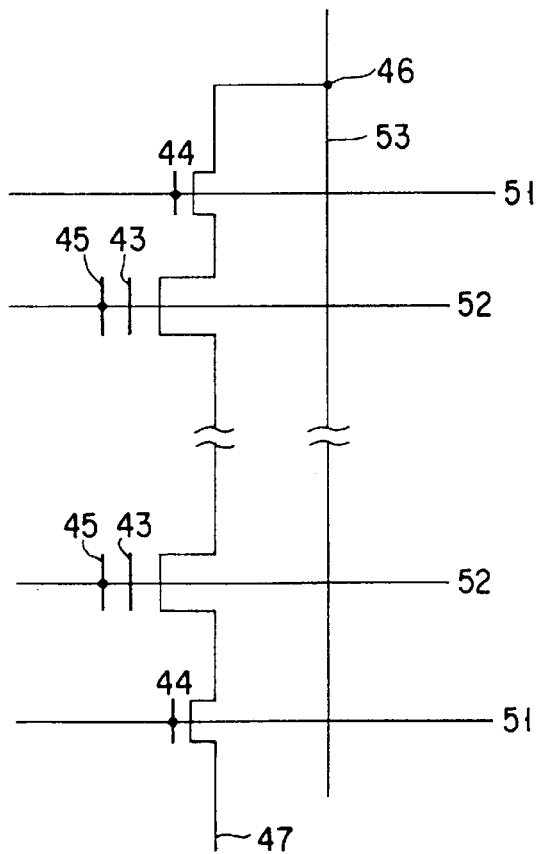
FIG. 13 is a circuit view showing a case wherein a uni-axial super-conductive wiring according to the eighth embodiment of the present invention is applied to a NAND cell.
Figure 14A:
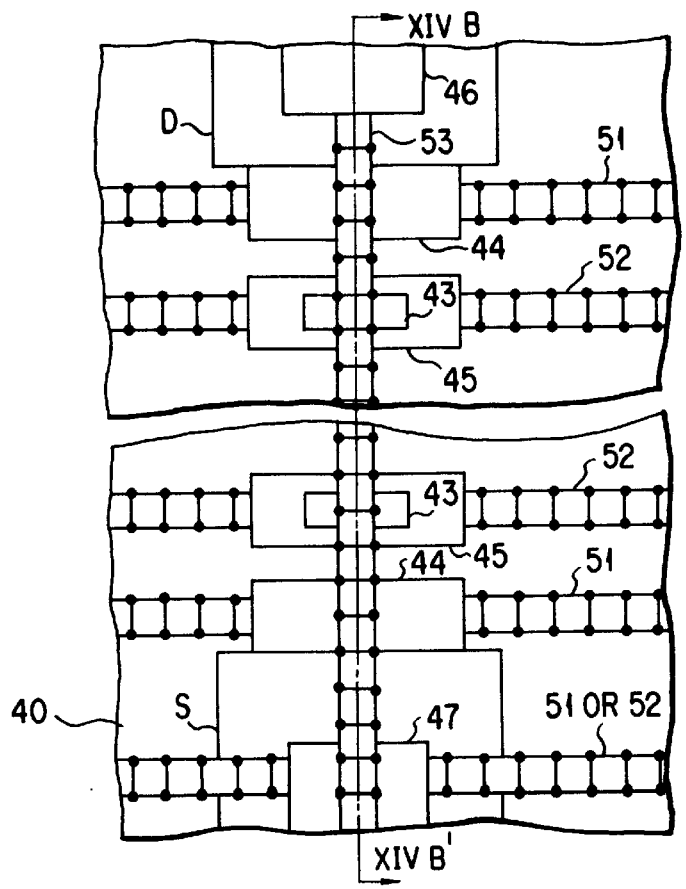
FIG. 14A is a plan view showing a case wherein a uni-axial super-conductive wiring according to the eighth embodiment is applied to a NAND cell.
Figure 14B:
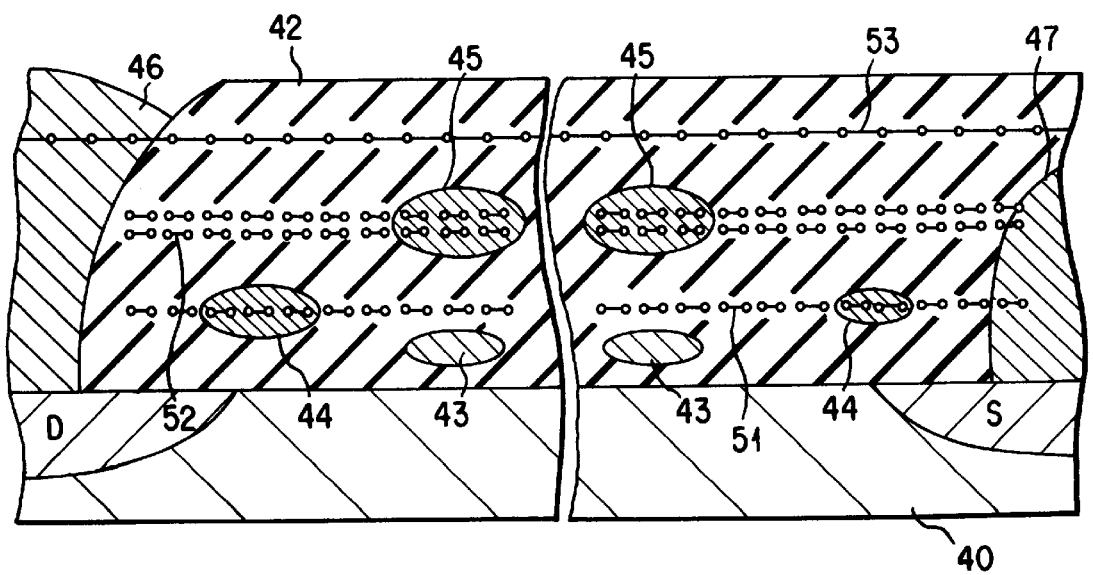
FIG. 14B is a cross-sectional view showing a case wherein a uni-axial super-conductive wiring according to the eighth embodiment is applied to a NAND cell.

The eighth embodiment of the present invention will be described next. FIGS. 13 to 15 show nonvolatile semiconductor memory devices according to the eighth embodiment, in which the present invention is applied to a NAND cell type EEPROM. FIG. 13 shows the circuit arrangement of a NAND cell according to this embodiment. FIGS. 14A and 14B show the detailed structure of the NAND cell, wherein FIG. 14A shows a plan view of the NAND cell, and FIG. 14B shows a sectional view of the NAND cell. FIGS. 15A and 15B show another structure of the NAND cell in detail, wherein FIG. 15A shows a plan view of the NAND cell, and FIG. 15B shows a sectional view of the NAND cell. Reference numeral 40 denotes an Si substrate; 42, an insulating film consisting of $SiO_2$ or the like; 43, charge-storage matrix, 44 and 45, gates; 46 and 47, contact electrodes; and 51 to 53, wiring ladder-like lattices forming ultra-fine uniaxial super-conductive wirings.

Referring to FIG. 14B, the ladder-like lattices 51 and 52 on the first and second layers are arranged in the same direction. The number of lattice layers included in each of first and second layers is not limited to one, but may be plural. A conductor is formed on a portion of the first layer to include at least one ladder-like lattice of the ladder-like lattices 51 so as to form the selection gate 44. Another conductor is formed to include a plurality of ladder-like lattices of the ladder-like lattices 52 on the second layer so as to form the control gate 45 connected to a word line of a memory cell. It is difficult to form elongate control gates arranged in one dimension as in the conventional manner if each element of the semiconductor device becomes so small as the size of atom. Therefore, it is desirable to connect the control gate arranged in a matrix manner to each other through an ultra-fine uni-axial super-conductive wiring having ladder-like lattice. The ladder-like lattice 53 on the third layer serves as a bit line, which is formed in a direction perpendicular to each word line. Note that the ladder-like lattice 53 may be multi-layer. In addition, it is desirable that a charge storage matrix 43 is formed between Si substrate 40 and the layer which includes the lattices 51.

Only the ladder-like lattice 53 serving as a bit line is connected to the contact electrode 46 on the drain D, and one or both of the ladder-like lattices 51 and 52 on the first and second layers (both of the lattices 51 and 52 in FIG. 14B) is or are connected to the contact electrode 47 on the source S.

This structure can be formed as follows. First of all, a charge storage matrices 43 is formed on the Si substrate 40 having a thin film such as an oxide film formed on its surface. The charge storage matrix 43 is covered with an insulative film. A matrix of selection gates 44 is formed. A super-conductive wiring is formed on the resultant structure. Since the super-conductive wiring according to this embodiment of the present invention has uniaxial directivity, it suffices if the super-conductive wiring is formed on a plurality of elements or all elements to cover a predetermined area. Therefore, patterning can be performed relatively easily. Further, it is possible to form the super-conductive wiring by use of self organization of crystal.

After the upper portions of the selection gate 44 are formed, the resultant structure is coated with an insulating film. In addition, a control gate lower portion, a super-conductive wiring layer 52, a control gate upper portion, an insulating film, a super-conductive wiring layer (the bit line 53), and an upper insulating film are stacked, thereby forming the above structure. The selection gate 44 and the control gate 45 need not be always stacked, and either upper or lower portion is required to be formed. For this reason, in this embodiment, alignment of source and drain contacts is at least required. It is desirable to form selection gates 44 and control gates 45 in a matrix manner.

In this embodiment, since ladder-like lattices are used, the distances between adjacent charge storage regions 43 and between the selection gates 44 and charge storage regions 43 can be theoretically reduced to several angstroms, and further diffusion regions to be formed in both sides of the charge storage region 43 of each memory cell can be omitted on the surface of the substrate 40. In addition, each size of the gates 44 and 45 can be reduced to several angstroms. For this reason, each memory cell can be reduced in size to several angstroms. With regard to each ladder-like lattice, R=0 is theoretically set. For this reason, the time required to read/write data can be extremely shortened. Cell transistors corresponding to one page can therefore be operated almost simultaneously. In addition, the backward bias to each memory cell can extremely be reduced. Since the selection gates 44 and control gates 45 are formed in a matrix manner, it is possible to realize a fine wiring like this.

The structure shown in FIGS. 15A and 15B are basically the same as that shown in FIG. 14A and 14B except that a charge storage region 43 is commonly used for a plural control gates 45 of which number corresponds to the number of bits of the NAND cell.

Figure 16:
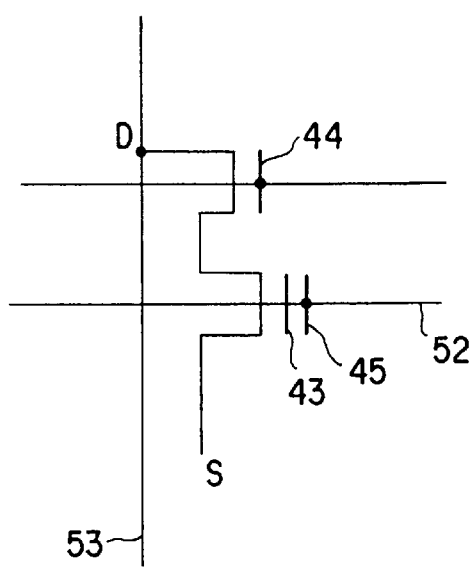
FIG. 16 is a circuit view showing a case wherein a uni-axial super-conductive wiring according to the ninth embodiment of the present invention is applied to a NOR cell.
Figure 17A:
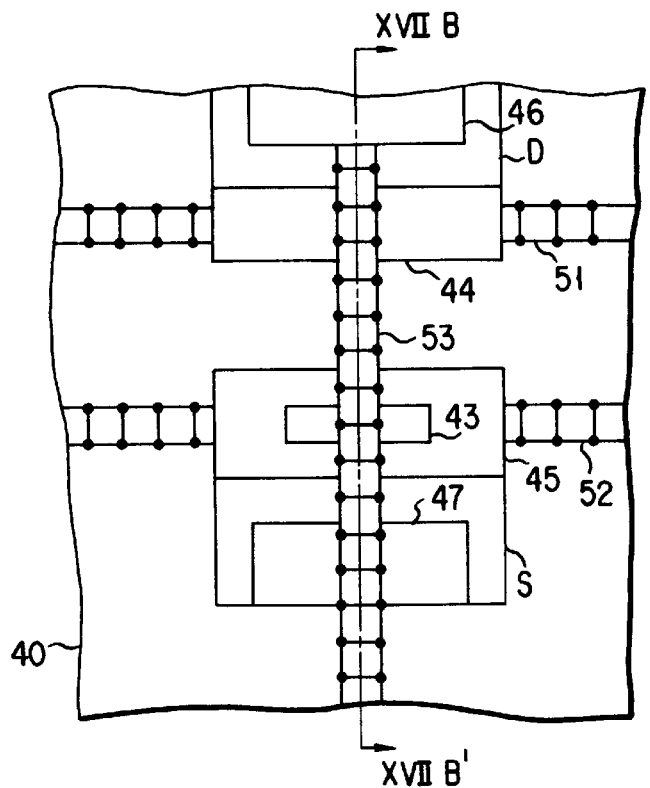
FIG. 17A is a plan view showing the case wherein the uni-axial super-conductive wiring according to the ninth embodiment of the present invention is applied to the NOR cell.
Figure 17B:
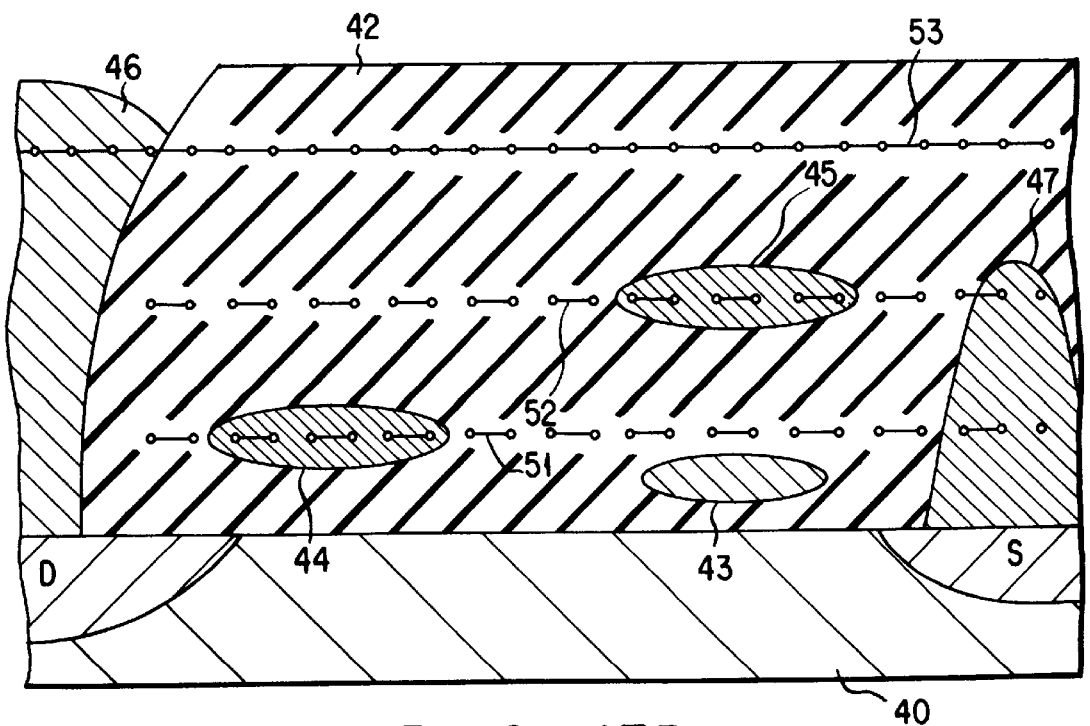
FIG. 17B is a cross-sectional view showing the case wherein the uni-axial super-conductive wiring according to the ninth embodiment of the present invention is applied to the NOR cell.

The ninth embodiment of the present invention will be described next. FIGS. 16 to 17B show a nonvolatile semiconductor memory device according to the ninth embodiment, more specifically, an example wherein the present invention is applied to a NOR cell type EEPROM. FIG. 16 shows the circuit arrangement of the NOR cell of this embodiment. FIGS. 17A and 17B show the structure of the NOR cell in detail, wherein FIG. 17A shows a plan view of the NOR cell, and FIG.17B shows a sectional view of the NOR cell. The same reference numerals in FIGS. 16 and 17 denote the same parts as in FIGS. 13 to 15 showing the eighth embodiment, and a detailed description thereof will be omitted.

Similar to the eighth embodiment, ladder-like lattices 51 and 52 on the first and second layers are formed as word lines in the same direction. A ladder-like lattice 53 on the third layer is formed as a bit line in a direction perpendicular to the word lines. The charge storage matrix 43, selection gates 44, the control gates 45, sources S, drain D, and contact portions 46 and 47 are formed in the same manner as in the eighth embodiment.

In this embodiment, similar to the eighth embodiment, since the distances between the adjacent charge storage regions 43 and between the selection gates 44 and charge storage regions 43 can be theoretically decreased to several angstroms, the diffusion regions in both sides of the charge storage region 43 can be omitted. In addition, the size of the gates 44 and 45 are extremely reduced. Each memory cell can therefore be reduced in size to several angstroms.

The present invention is not limited the above embodiments. A super-conductive wiring material, an Sr compound containing Cu and O is used. However, the present invention is not limited to this. Any material can be used as long as it has a ladder-like lattice structure like the one shown in FIG. 1 and exhibits uni-axial superconductivity in the longitudinal direction of the ladder like lattice. More specifically, (1) $X_xY_yZ_zCu_\alpha O_\beta$, wherein X, Y, Z are selected from the group consisting of Sr, La, Ca, Ba, and Y and (2) $(VO)_2P_2O_7$ may be used. In FIG. 1, a ladder-like double-chain lattice is shown. However, the crystal structure is not limited to this. For example, a ladder-like multiple-chain lattice (e.g., 4-chain ladder, 6-chain ladder, or the like) may be used.

Figure 18:
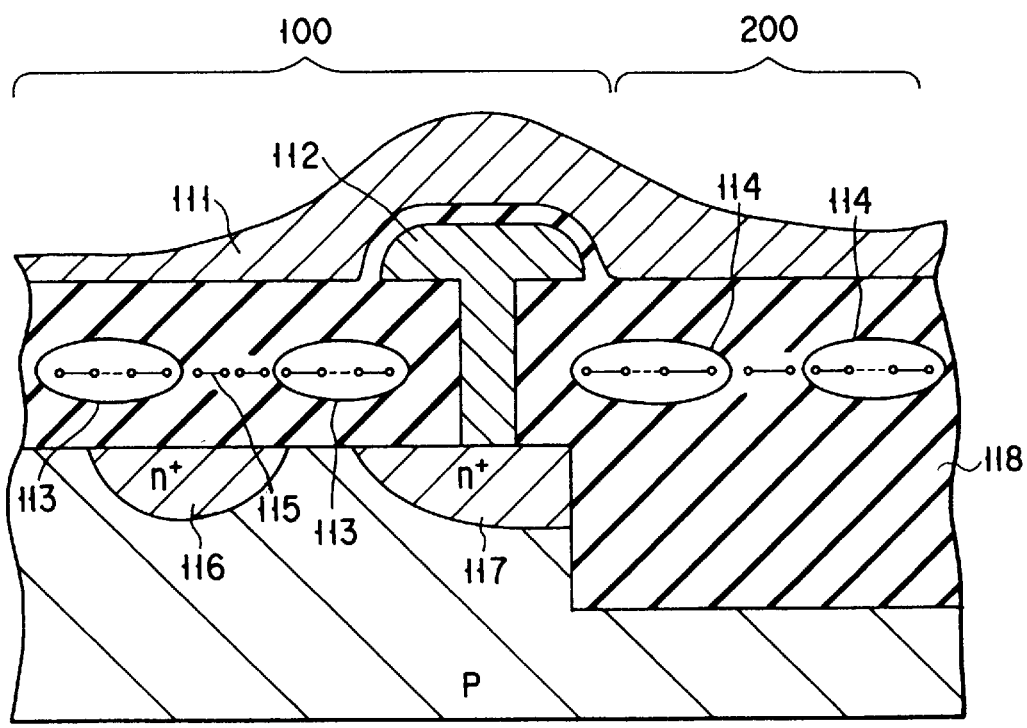
FIG. 18 is a view showing element isolation in a DRAM.

The present invention can be applied to all fields requiring fine wirings or isolations, e.g., DRAMs, SRAMs, logic LSIs, and liquid crystal displays. FIG. 18 shows an example of element isolation in a DRAM. Referring to FIG. 18, reference numeral 100 denotes a circuit element (DRAM); 200, an isolation element area ; 111, a plate electrode; 112, a storage-node electrode; 113, a gate electrode; 114, a diffusion regions; 115, a super-conductive wiring; 116 and 117, a diffusion regions of sources and drains, respectively; and 118, an insulation regions. In FIG. 18, P is a substrate of P type.

As a diffusion region 114, a circuit element such as a transistor, a resistor, conductor, or a capacitor, an electrode, diffusion layer constituting a portion of the circuit element may be properly selected. Various changes and modifications can be made without departing from the spirit and scope of the invention.

What is claimed is:

1. A wiring layer used for an integrated circuit device, comprising:
    a single crystal material having a lattice structure and exhibiting conductivity only in one direction of said lattice structure of said single crystal material, and
    wherein each lattice structure extending in said one direction comprises a wire of said wiring layer.

2. A wiring layer according to claim 1, wherein said material is an Sr, Y, Ca or Ba compound containing Cu and O.

3. A wiring layer according to claim 1, wherein said material is an La-series compound containing Cu and O.

4. A wiring layer according to claim 1, wherein said material is a $(VO)_2P_2O_7$ compound.

5. A wiring layer according to claim 1, wherein said material is a single crystal compound having a double-chain lattice structure or a multiple-chain lattice structure.

6. A wiring layer according to claim 1, wherein said wire connects arbitrary functional devices included in the integrated circuit device.

7. An integrated circuit device comprising:
    a plurality of integrated circuit layers or portions of functional devices formed on a semiconductor substrate; and
    a wiring layer having a lattice structure and formed of a single crystal material exhibiting conductivity only in one direction of said lattice structure of said single crystal material, each lattice structure extending in said one direction being a wire connecting arbitrary integrated circuit layers of said plurality of integrated circuit layers or arbitrary portions of functional devices of said plurality of portions of functional devices.

8. A device according to claim 7, wherein said wiring layer comprises a ladder-like lattice connecting first and second integrated circuit layers to each other.

9. A device according to claim 7, wherein said wiring layer comprises at least two electrically independent ladder-like lattices connecting first and second integrated circuit layers to each other.

10. A device according to claim 7, wherein said wiring layer comprises electrically independent first and second ladder-like lattices, the first ladder-like lattice connecting first and second integrated circuit layers to each other, and the second ladder-like lattice connecting a third and said second integrated circuit layers to each other such that said first integrated circuit layer is indirectly connected to said third integrated circuit layer.

11. A device according to claim 7, wherein said wiring layer comprises:
    electrically independent first and second pluralities of ladder-like lattices;
    a conductive member having a three-dimensional structure and connecting the first and second pluralities of ladder-like lattices to each other.

12. A device according to claim 7, wherein said three-dimensional wiring structure comprises first and second layers formed of said material, and a contact region for connecting a ladder-like lattice on said first layer to a ladder-like lattice on said second layer.

13. A device according to claim 7, wherein said three-dimensional wiring structure comprises three or more layers formed of said material, and a contact region for connecting ladder-like lattices on said respective layers to each other.

14. A device according to claim 7, wherein said three-dimensional wiring structure comprises first and second layers formed of said material, and a contact region for connecting a plurality of ladder-like lattices on said first layer to a plurality of ladder-like lattices on said second layer.

15. A device according to claim 7, wherein said three-dimensional wiring structure comprises three or more layers formed of said material, and a contact region for connecting a plurality of ladder-like lattices on said respective layers to each other.

16. A device according to claim 7, wherein said material is an Sr, Y, Ca, or Ba compound containing Cu and O.

17. A device according to claim 7, wherein said material is an La-series compound containing Cu and O.

18. A device according to claim 7, wherein said material is a $(VO)_2P_2O_7$ compound.

19. A device according to claim 7, wherein said material is a single crystal compound having a double-chain lattice structure or a multiple-chain lattice structure.

20. An electrical isolation layer, comprising:
    a single crystal material having a lattice structure, and
    wherein said single crystal material exhibits a higher resistance in a widthwise direction than in a longitudinal direction of said single crystal material.

21. An isolation layer according to claim 20, wherein said material is an Sr, Y, Ca, or Ba compound containing Cu and O.

22. An isolation layer according to claim 20, wherein said material is an La-series compound containing Cu and O.

23. An isolation layer according to claim 20, wherein said material is a $(VO)_2.P_2O_7$ compound.

24. An isolation layer according to claim 20, wherein said material is a single crystal compound having a double-chain lattice structure or a multiple-chain structure.

25. An integrated circuit device comprising:
    a plurality of integrated circuit layers or portions of functional devices formed on a semiconductor substrate; and
    an isolation layer formed of a single crystal material having a lattice structure and exhibiting a higher resistance in a widthwise direction than in a longitudinal direction of said single crystal material, said isolation layer isolating an arbitrary integrated circuit layers of said plurality of integrated circuit layers or arbitrary portions of functional devices of said plurality of portions of functional devices.

26. A device according to claim 25, wherein said isolation layer comprises a ladder-like lattice isolating a first integrated circuit layer from a second integrated circuit layer or a portion of functional device.

27. A device according to claim 25, wherein said isolation layer comprises a ladder-like lattice isolating a first portion of functional devices from a second portion or a circuit layer.

28. A device according to claim 25, wherein said isolation layer comprises at least two electrically independent ladder-like lattices isolating a first integrated circuit layer from a second integrated circuit layer or a portion of functional device.

29. A device according to claim 25, wherein said electrically independent ladder-like lattices isolating a first portion of functional device from a second portion or a circuit layer.

30. A device according to claim 25, wherein said material is an Sr, Y, Ca, or Ba compound containing Cu and O.

31. A device according to claim 25, wherein said material is an La-series compound containing Cu and O.

32. A device according to claim 25, wherein said material is a $(VO)_2P_2O_7$ compound.

33. A device according to claim 25, wherein said material is a single crystal compound having a double-chain lattice structure or a multiple-chain lattice structure.

34. An integrated circuit device comprising:

a plurality of integrated circuit layers or portions of functional devices formed on a semiconductor substrate;

a wiring layer formed of a single crystal material having a lattice structure and exhibiting conductivity in one direction of said single crystal material, each lattice structure extending in said one direction being a wire connecting arbitrary integrated circuit layers or portions of functional devices of said plurality of integrated circuit layers or portions of functional devices; and an isolation layer formed of a single crystal material having a lattice structure and exhibiting a higher resistance in a widthwise direction than in a longitudinal direction of said lattice structure of said single crystal material, said isolation layer isolating an arbitrary integrated circuit layer or a portion of functional device of said plurality of integrated circuit layers or portions of functional devices.

* * * * *